(12) United States Patent
Haeusser-Boehm et al.

(10) Patent No.: US 6,653,887 B2
(45) Date of Patent: Nov. 25, 2003

(54) SELF-LOCKING CIRCUIT ARRANGEMENT

(75) Inventors: Helmut Haeusser-Boehm, Munich (DE); Michael Schaller, Traunreut (DE)

(73) Assignee: Patent-Treuhand-Gesellschaft fuer Elektrische Gluehlampen mbH, Munich (DE)

( * ) Notice: Subject to any disclaimer, the term of this patent is extended or adjusted under 35 U.S.C. 154(b) by 0 days.

(21) Appl. No.: 09/962,347

(22) Filed: Sep. 26, 2001

(65) Prior Publication Data

US 2002/0036535 A1 Mar. 28, 2002

(30) Foreign Application Priority Data

Sep. 28, 2000 (DE) .......................... 100 48 188

(51) Int. Cl.⁷ ............................................. H03K 17/687
(52) U.S. Cl. ....................................... 327/478; 327/427
(58) Field of Search ............................... 327/427, 432, 327/434, 439, 459, 474, 478, 491, 536; 323/312, 907, 299, 234, 282

(56) References Cited

U.S. PATENT DOCUMENTS

| | | | |
|---|---|---|---|
| 5,319,251 A | * | 6/1994 | Gotz ........................... 327/14 |
| 5,323,063 A | * | 6/1994 | Chiba et al. ................ 327/100 |
| 5,384,529 A | * | 1/1995 | Nakago ...................... 323/312 |
| 6,175,264 B1 | * | 1/2001 | Jinbo ........................ 327/534 |

OTHER PUBLICATIONS

A. Umezawa et al., "A 5–V–Only Operation 0.6–um Flash EEPROM with Row Decoder Scheme in Triple–Well Structure", IEEE Journal of Solid State Circuits, vol. 27, No. 11, Nov. 1992, pp. 1540–1546.*

* cited by examiner

Primary Examiner—Timothy P. Callahan
Assistant Examiner—Linh Nguyen
(74) Attorney, Agent, or Firm—Carlo S. Bessone

(57) ABSTRACT

The present invention relates to a self-locking circuit arrangement having an input voltage connection for applying an input voltage (UE), an output voltage connection for providing an output voltage (UA), a supply voltage connection for connecting a supply voltage (UV), a first switching element (T1) having a first and a second output connection and a control connection, a second switching element (T2) having a first and a second output connection and a control connection, where the first output connection of the first switching element (T1) is connected to the output voltage connection, the second output connection of the first switching element (T1) is connected to a reference-ground potential, the first output connection of the second switching element (T2) and also the control connection of the first switching element (T1) are connected to the input voltage connection, the second output connection of the second switching element (T2) is connected to the reference-ground potential, and the control connection of the second switching element (T2) is connected to the output voltage connection.

6 Claims, 1 Drawing Sheet

SELF-LOCKING CIRCUIT ARRANGEMENT

TECHNICAL FIELD

The present invention relates to a self-locking circuit arrangement having an input voltage connection for applying an input voltage, an output voltage connection for providing an output voltage, a supply voltage connection for connecting a supply voltage, a first switching element having a first and a second output connection and a control connection, and also a second switching element having a first and a second output connection and a control connection.

PRIOR ART

Self-locking circuit arrangements containing thyristors are known from the prior art. These circuit arrangements provide, by way of example, protection in case a voltage becomes too high. If, by way of example, a voltage rises above a particular value, the thyristor triggers, as a result of which, with suitable circuitry, the output voltage returns to 0 volts. In this context, self-locking circuit arrangements should be understood as meaning circuit arrangements whose disconnection is intended to be irreversible, that is to say that the appliance powered thereby can continue to operate only as a result of a power supply reset or the like.

When there has been no disconnection, the output voltage of a self-locking circuit arrangement containing a thyristor is usually in the region of the supply voltage.

DESCRIPTION OF THE INVENTION

Against the background of this prior art, the present invention is based on the object of developing a generic self-locking circuit arrangement such that it is possible to dispense with a thyristor, and reliable, irreversible disconnection can be prompted if the input voltage drops below a predetermined value.

This object is achieved by virtue of the fact that, in the generic self-locking circuit arrangement, the first output connection of the first switching element is connected to the output voltage connection, the second output connection of the first switching element is connected to a reference-ground potential, the first output connection of the second switching element and also the control connection of the first switching element are connected to the input voltage connection, the second output connection of the second switching element is connected to the reference-ground potential, and the control connection of the second switching element is connected to the output voltage connection.

The present invention is based on the realization that a self-locking circuit arrangement can be produced simply and inexpensively by suitably interconnecting two transistors, in particular two bipolar transistors.

Preferably, the first and/or the second switching element is produced using a bipolar transistor or a field effect transistor. This makes it possible to attain the advantage that the circuit can be operated using very low driving power, since significantly less power need be applied than for triggering a thyristor.

Preferably, the circuit is designed such that the circuit arrangement can be locked by once lowering the input voltage to below a prescribable value. This circuit therefore makes it possible to ensure that a disconnection operation is initiated if another appliance's supply voltage which is used as input voltage for the self-locking circuit arrangement drops below a prescribed value.

The use of suitable switching measures makes it possible to ensure that, when the circuit arrangement is blocked, the output voltage assumes a voltage which corresponds to the supply voltage multiplied by a factor a, where $0 \leq a \leq 1$. The control connection of the second switching element can be provided with a voltage which corresponds to the supply voltage multiplied by a factor b, where $0 \leq b \leq 1$. This is preferably achieved by using a voltage divider.

Preferably, the block on the inventive circuit arrangement can be removed by briefly decoupling the supply voltage or shorting the output voltage, in particular using a switch, pushbutton switch or transistor.

Other advantageous embodiments can be found in the subclaims.

DESCRIPTION OF THE DRAWINGS

An exemplary embodiment is now described in more detail below with reference to the appended drawings, in which:

FIG. 1 shows a self-locking circuit arrangement which has an input voltage connection for applying an input voltage UE, an output connection for providing an output voltage UA, and also a supply voltage connection for connecting a supply voltage UV. It comprises a transistor T1 and a transistor T2. The collector of the transistor T1 is connected firstly to the output connection, and secondly to the supply voltage UV via a resistor R1. The emitter of the transistor T1 is connected to reference-ground potential. The output voltage UA is divided by means of a voltage divider, comprising the resistors R2 and R3, and the voltage drop across the resistor R3 is applied to the base of the transistor T2. The base of the transistor T1 is connected firstly to the input connection via a resistor R4, and secondly to the collector of the transistor T2. The emitter of the transistor T2 is again connected to reference-ground potential.

The self-locking circuit arrangement shown in FIG. 1 operates as follows: initially, the input voltage UE is high, specifically so high that the voltage drop between the base and the emitter of the transistor T1 is sufficient to turn on the transistor T1. As a result of T1 being in the on state, the output voltage UA is 0 volts. However, this means that there is no voltage applied to the base of the transistor T2 either, that is to say that the transistor T2 is in the off state. The corresponding voltage waveforms are shown in FIG. 2, where the initial state relates to the period 0 to t1. At the instant t1, the input voltage UE decreases. This reduces the base-emitter voltage of the transistor T1 to such an extent that this transistor is turned off. Point P is now no longer shorted via the transistor T1. Accordingly, UA rises to a value which is fundamentally dependent on the supply voltage UV and on the resistors R1, R2 and R3. This rise in UA produces a voltage drop across the resistor R3 which, with suitable dimensioning, serves to turn on the transistor T2. As soon as the transistor T2 is in the on state, the voltage drop between the base and the emitter of transistor T1 is always equal to 0. This means that transistor T1 is permanently in the off state. The circuit arrangement is thus in the locked state.

On account of the transistor T2 being in the on state, changes to the input voltage, cf. the pulses at the instants T2 and T3 in FIG. 2, for example, are unable to reverse the locking. This is possible only by briefly decoupling the supply voltage or shorting the output voltage, in particular using a switch, pushbutton switch or transistor.

Figure 1:
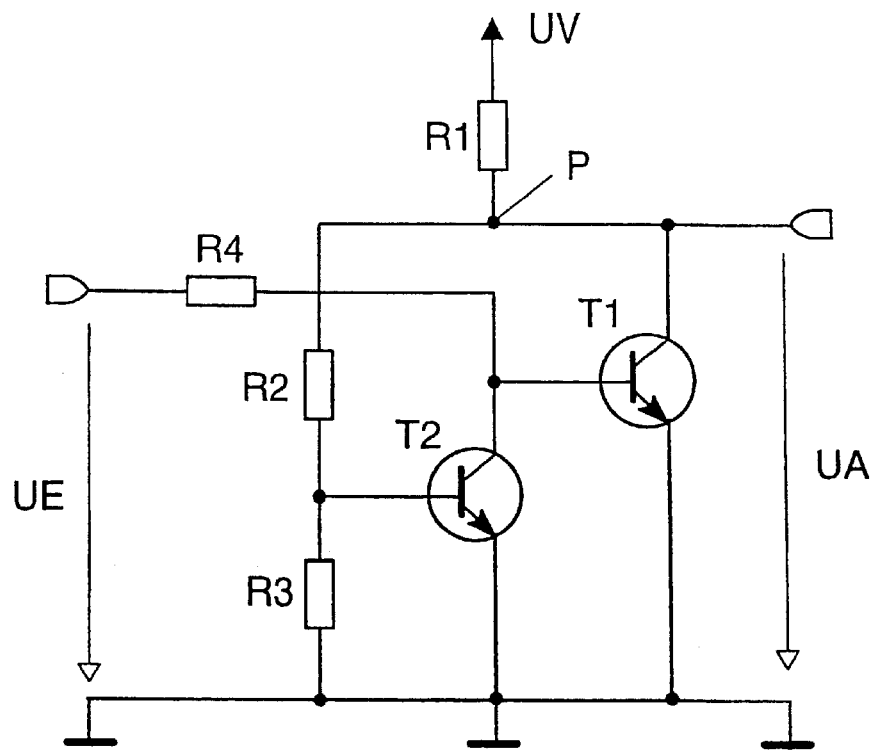
FIG. 1 shows an exemplary embodiment of an inventive circuit arrangement.
Figure 2:
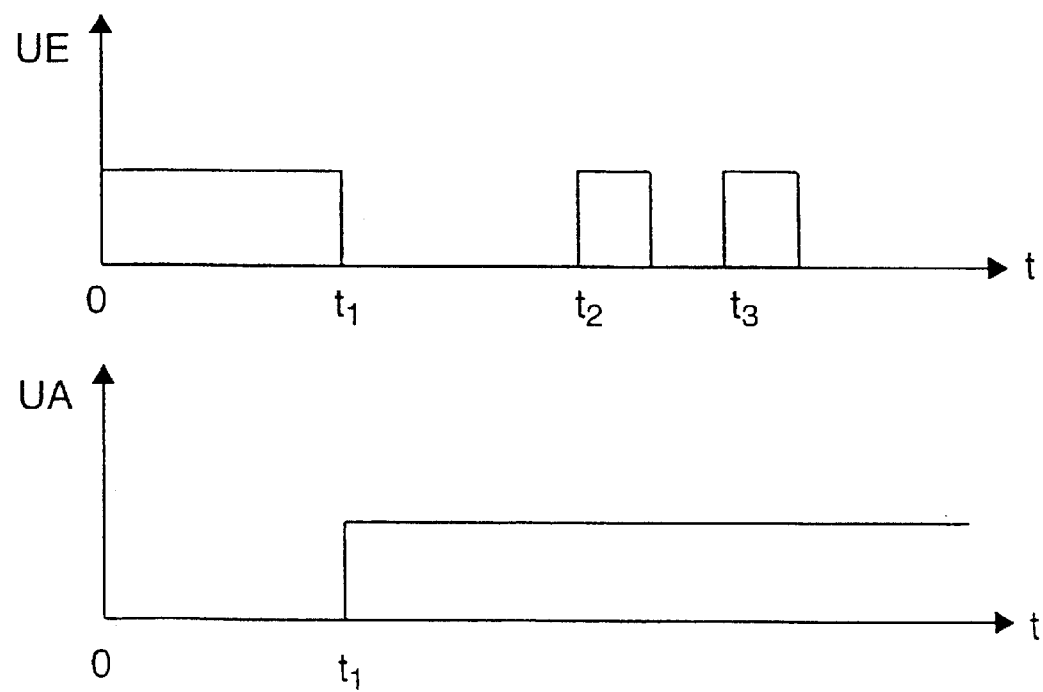
FIG. 2 shows a schematic illustration of the waveform of the input voltage UE and of the output voltage UA.

As is obvious to the person skilled in the art, the circuit can also be produced using other circuit elements, for example field effect transistors, or complementary components, e.g. pnp transistors instead of the npn transistors shown in FIG. 1.

What is claimed is:

1. A circuit arrangement comprising:
   an input voltage connection for applying an input voltage (UE);
   an output voltage connection for providing an output voltage (UA);
   supply voltage connection for connecting a supply voltage (UV);
   a first switching element (T1) having a first and a second output connection and a control connection;
   a second switching element (T2) having a first and a second output connection and a control connection;
   a voltage divider connected in parallel with the output voltage connection and having a junction connected to the control connection of the second switching element (T2);
   the first output connection of the first switching element (T1) is connected to the output voltage connection, the second output connection of the first switching element (T1) is connected to a reference-ground potential;
   the first output connection of the second switching element (T2) and also the control connection of the first switching element (T1) are connected to the input voltage connection, the second output connection of the second switching element (T2) is connected to the reference-ground potential; and
   the control connection of the second switching element (T2) is connected to the output voltage connection thereby forming a self-locking circuit whereby the output voltage (UA) rises from zero to a prescribable value dependent on the supply voltage (UV) following a decrease in the input voltage (UE), the output voltage remaining at the prescribable value until the supply voltage (UV) is decoupled or the output voltage (UA) is shorted.

2. Circuit arrangement according to claim 1, wherein the first and/or the second switching element (T1; T2) comprises a bipolar transistor or a field effect transistor.

3. Circuit arrangement according to claim 1, wherein the circuit arrangement can be locked by once lowering the input voltage (UE) to below a prescribable value.

4. Circuit arrangement according to claim 1, wherein when the circuit arrangement is locked, the output voltage (UA) can assume a voltage which corresponds to the supply voltage multiplied by a factor a, where $0 \leq a \leq 1$.

5. Circuit arrangement according to claim 1, wherein the control connection of the second switching element (T2) can be provided with a voltage which corresponds to the supply voltage (UV) multiplied by a factor b, where $0 \leq b \leq 1$.

6. Circuit arrangement according to claim 1, wherein the block on the circuit arrangement is removed by briefly decoupling the supply voltage (UV) or shorting the output voltage (UA) using a switch, pushbutton switch or transistor.

* * * * *